US006384103B1

United States Patent
Arano et al.

(10) Patent No.: US 6,384,103 B1
(45) Date of Patent: May 7, 2002

(54) RADIATION-SENSITIVE RESIN COMPOSITION

(75) Inventors: Akio Arano, Minoo; Kenji Yamamoto, Shizuoka, both of (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 09/701,851

(22) PCT Filed: Mar. 3, 2000

(86) PCT No.: PCT/JP00/01259

§ 371 Date: Dec. 1, 2000

§ 102(e) Date: Dec. 1, 2000

(87) PCT Pub. No.: WO00/60416

PCT Pub. Date: Oct. 12, 2000

(30) Foreign Application Priority Data

Apr. 2, 1999 (JP) ............................................. 11-96352

(51) Int. Cl.$^7$ ................................ C08F 2/48; C08F 2/50
(52) U.S. Cl. ........................ 522/166; 522/47; 522/162; 522/48; 430/191; 430/56; 430/189; 430/170
(58) Field of Search .......................... 430/191, 56, 189, 430/170; 522/47, 48, 162, 166.1

(56) References Cited

U.S. PATENT DOCUMENTS 4,812,551 A * 3/1989 Oi et al. ..................... 528/129
5,019,479 A * 5/1991 Oka et al. ................... 430/172
5,736,292 A * 4/1998 Ida et al. .................... 430/191
5,753,406 A * 5/1998 Miyashita et al. .......... 430/191
5,783,355 A * 7/1998 Ida et al. .................... 430/191
5,792,585 A * 8/1998 Ida et al. .................... 430/191

FOREIGN PATENT DOCUMENTS

JP          58-84814        *  5/1983

* cited by examiner

Primary Examiner—James J. Seidleck
Assistant Examiner—Sanza L McClendon
(74) Attorney, Agent, or Firm—Krishna Banerjee

(57) ABSTRACT

Radiation-sensitive resin composition having excellent and well-balanced various properties required for photoresist, such as sensitivity, pattern profile and heat resistance. The radiation-sensitive resin composition comprises an alkali-soluble resin and a photosensitizer having a quinonediazide group. The alkali-soluble resin is a phenol novolak resin which is treated by a thin film distillation method to selectively remove monomer and dimer. The novolak resin treated by thin film distillation method preferably shows the following ratio in area in its profile in gel permeation chromatography with a detector at 280 nm:

$$B_2/B_1 \geq 0.95; \quad C_2/(A_2+B_2+C_2) \leq 0.060$$

wherein $A_1$ is a high-molecular region, $B_1$ is a middle-molecular region, and $C_1$ is a monomer/dimer region before the treatment of the starting novolak resin, and $A_2$, $B_2$ and $C_2$ are the corresponding counterparts after the treatment of the novolak resin.

6 Claims, 4 Drawing Sheets

Peak Table

|   | Retention time | Area | Area % | Height | Starting time | Ending time | |
|---|---|---|---|---|---|---|---|
| 1 | 25.026 | 67233815 | 26.65 | 579853 | 21.033 | 25.867 | $A_1$ |
| 2 | 26.956 | 67850203 | 26.90 | 534477 | 25.867 | 28.350 | |
| 3 | 28.837 | 53487766 | 21.20 | 390337 | 28.350 | 30.883 | |
| 4 | 31.123 | 10498106 | 4.16 | 292586 | 30.883 | 31.533 | $B_1$ |
| 5 | 31.884 | 12120673 | 4.81 | 286890 | 31.533 | 32.383 | |
| 6 | 32.984 | 16288815 | 6.46 | 320725 | 32.383 | 33.850 | |
| 7 | 34.358 | 8989450 | 3.56 | 265985 | 33.850 | 34.717 | $C_1$ |
| 8 | 35.133 | 14652764 | 5.81 | 441041 | 34.717 | 36.867 | |
| 9 | 37.852 | 1121678 | 0.44 | 29987 | 36.867 | 38.867 | |

Peak Table

| | Retention time | Area | Area % | Height | Starting time | Ending time | |
|---|---|---|---|---|---|---|---|
| 1 | 20.892 | 2705 | 0.00 | 360 | 20.692 | 20.908 | A₂ |
| 2 | 24.922 | 75979875 | 30.42 | 593490 | 20.908 | 25.808 | |
| 3 | 28.872 | 68204855 | 27.31 | 537615 | 25.808 | 28.275 | |
| 4 | 28.746 | 54384321 | 21.77 | 396551 | 28.275 | 30.808 | B₂ |
| 5 | 31.046 | 10574928 | 4.23 | 294354 | 30.808 | 31.458 | |
| 6 | 31.802 | 11973323 | 4.79 | 282231 | 31.458 | 32.308 | |
| 7 | 32.886 | 15002882 | 6.01 | 290037 | 32.308 | 33.758 | |
| 8 | 34.245 | 6339865 | 2.54 | 177161 | 33.758 | 36.642 | C₂ |
| 9 | 35.033 | 6622175 | 2.65 | 190823 | 34.642 | 36.508 | |
| 10 | 37.133 | 467363 | 0.19 | 15048 | 36.558 | 37.458 | |
| 11 | 37.458 | 230074 | 0.09 | 7541 | 37.458 | 38.358 | |

Peak Table

| | Retention time | Area | Area % | Height | Starting time | Ending time | |
|---|---|---|---|---|---|---|---|
| 1 | 24.976 | 95226694 | 37.23 | 804763 | 20.918 | 25.902 | $A_2$ |
| 2 | 26.821 | 120398521 | 47.07 | 621385 | 25.902 | 30.868 | |
| 3 | 31.076 | 7412291 | 2.90 | 213574 | 30.868 | 31.502 | $B_2$ |
| 4 | 31.844 | 8314450 | 3.25 | 197862 | 31.502 | 32.352 | |
| 5 | 32.948 | 10391864 | 4.06 | 204556 | 32.352 | 33.818 | |
| 6 | 34.324 | 5357992 | 2.09 | 159662 | 33.818 | 34.685 | |
| 7 | 35.094 | 8216287 | 3.21 | 248909 | 34.685 | 36.735 | $C_2$ |
| 8 | 37.152 | 6345 | 0.00 | 765 | 36.935 | 37.168 | |
| 9 | 37.803 | 463856 | 0.18 | 14650 | 37.168 | 38.735 | |

RADIATION-SENSITIVE RESIN COMPOSITION

TECHNICAL FIELD

This invention relates to a novel radiation-sensitive resin composition and, more particularly, to a radiation-sensitive resin composition containing an alkali-soluble novolak resin, suited for manufacture of semiconductors, preparation of a display surface of liquid crystal display panel, manufacture of a circuit substrate for thermal head etc., and like use.

BACKGROUND ART

In the wide field of manufacturing semiconductors such as LSI, preparing a display surface of liquid crystal display panel, manufacturing a circuit substrate for thermal head etc., and like use, photolithography has so far been employed for forming microelements or conducting fine processing. In the photolithography, a positive- or negative-working radiation-sensitive resin composition is used for forming a resist pattern. Of these radiation-sensitive resin compositions, those compositions which contain an alkali-soluble resin and a photosensitizer of quinonediazide compound are most popularly used as the positive-working radiation-sensitive resin compositions. As such compositions, there are described compositions containing novolak resin and the quinonediazide compound and having different formulations in many documents such as Japanese Examined Patent Publication No. S54-23570 (U.S. Pat. No. 3,666,473), Japanese Examined Patent Publication No. 56-30850 (U.S. Pat. No. 4,115,128), Japanese Unexamined Patent Publication Nos. S55-73045, S61-205933 and S62-51459, etc. These compositions containing the novolak resin and the quinonediazide compound have so far been investigated from the viewpoint of both the novolak resin and the photosensitizer. From the viewpoint of the novolak resin, improvement of physical properties of conventionally known resins have been conducted, as well as development of novel resins, to obtain radiation-sensitive resins with excellent properties. For example, Japanese Unexamined Patent Publication Nos. S60-140235 and H1-105243 disclose techniques of imparting a particular molecular weight distribution to a novolak resin to thereby provide a radiation-sensitive resin composition having excellent properties.

However, many of conventional radiation-sensitive resin compositions still have problems such as a poor balance among various properties including sensitivity, resolution, depth of focus, pattern profile, coating-remaining ratio, heat resistance, etc., and have been required to be more improved. Particularly, in the process of manufacturing flat panel display, it has been an important subject to reduce the content of monomer and dimer in the alkali-soluble resin components as well as improvement of the above-described properties. That is, there has been a problem that, when prebaking is conducted after applying the radiation-sensitive resin composition on a substrate, monomer and dimer components in the alkali-soluble resin will vaporize during the prebaking together with a solvent and stain the inside of the prebaking furnace, resulting in contamination with impurities in the steps of manufacturing devices. For example, Japanese Unexamined Patent Publication Nos. 57-86831, S60-230136, and H3-230164 disclose the technique of fractionating a low-molecular resin component by solvent fractionation. However, this solvent fractionation technique has a problem that, since a middle-molecular component in the resin is also fractionated away as well as the monomer and dimer components, there results a reduction in sensitivity. As a technique for preventing the reduction, there may be considered a technique of subjecting an alkali-soluble resin having a previously decreased weight average molecular weight to the solvent fractionation. Such alkali-soluble resin, however, has a poor coating-remaining ratio and a poor heat resistance, though a sufficient sensitivity can be obtained, thus it having been extremely difficult to obtain a radiation-sensitive resin composition having well-balanced properties described above. In addition, most of the low-molecular component of the alkali-soluble resin fractionated by the solvent fractionation is not used as the material for radiation-sensitive resin composition and is discarded as a waste. Such manufacturing process not only provides the radiation-sensitive resin composition with an increased manufacturing cost but imposes a serious load on surrounding environment.

On the other hand, as a method for fractionating compounds, thin film distillation method has already been known. This thin film distillation method is a method of fractionating by forming a thin film of a material to be distilled on a heat transferring dish or the like by employing mechanical centrifugation force, inertia force, a dispersing apparatus, etc. to conduct distillation, thus accelerating evaporation of monomers. Heretofore, the thin film distillation method has been reported to be used in a process for manufacturing polyhydroxy compounds which are starting materials for epoxy resins (Japanese Unexamined Patent Application No. H10-87538), a process for purifying xylenol (Czechoslovakian Inventor's Certificate No. 239793) and a process for removing materials having a low melting point in waxes to be used for toner for developing statically charged image (Japanese Unexamined Patent Publication No. 7-36218). However, it has not been known to specifically apply this technique of thin film distillation to the binder resin for radiation-sensitive resin composition. Although the aforesaid Japanese Unexamined Patent Application No. H3-230164 describes that a low molecular component of novolak resin may be removed by the thin film distillation method, it merely illustrates that as an equivalent technique to the method of solvent fractionation, and nothing is disclosed as to treating conditions and the like. That is, it merely shows possibility and does not show that the thin film distillation method is more excellent than the method of solvent fractionation.

An object of the present invention is to provide a radiation-sensitive resin composition having no defects described above, having excellent sensitivity, resolution, pattern profile, heat resistance, etc. required for photoresist, and having these properties with good balance.

DISCLOSURE OF THE INVENTION

As a result of intensive investigations, the inventors have found that the above-described object can be attained by using, in the radiation-sensitive resin composition containing an alkali-soluble resin and a photosensitizer having a quinonediazide group, a novolak resin treated by the thin film distillation method to partially and selectively remove monomer and dimer so that the amounts of monomer and diner in the resin fall within a given range as the alkali-soluble resin, thus having achieved the present invention based on the finding.

That is, the present invention relates to a radiation-sensitive resin composition containing an alkali-soluble resin and a photosensitizer having a quinonediazide group, wherein the alkali-soluble resin is a novolak resin treated by a thin film distillation method.

DETAILED DESCRIPTION OF THE INVENTION

Novolak resins to be used in the present invention are novolak type phenol resins obtained by polycondensation between one or more of various phenols and an aldehyde such as formalin. These resins are subjected to the thin film distillation method so as to reduce the content of monomer and dimer to a given scope. In the present invention, the novolak resin treated by thin film distillation method preferably shows the following ratio in area in its profile in gel permeation chromatography (GPC) with a detector at 280 nm:

$$C_2/(A_2+B_2+C_2) \leq 0.060;\ B_2/B_1 \geq 0.95$$

wherein $A_1$ is a high-molecular region, $B_1$ is a middle-molecular region, and $C_1$ is a monomer/dimer region before fractional treatment of the starting novolak resin, and $A_2$, $B_2$ and C2 are the corresponding counterparts after fractional treatment of the novolak resin. That is, novolak resins containing not more than 6% of monomer/dimer and showing the ratio in area in their profile in GPC of the middle region after the treatment to that before the treatment, $B_2/B_1$, of not less than 0.95 (i.e., middle region mostly remaining) are preferred.

Figure 1:
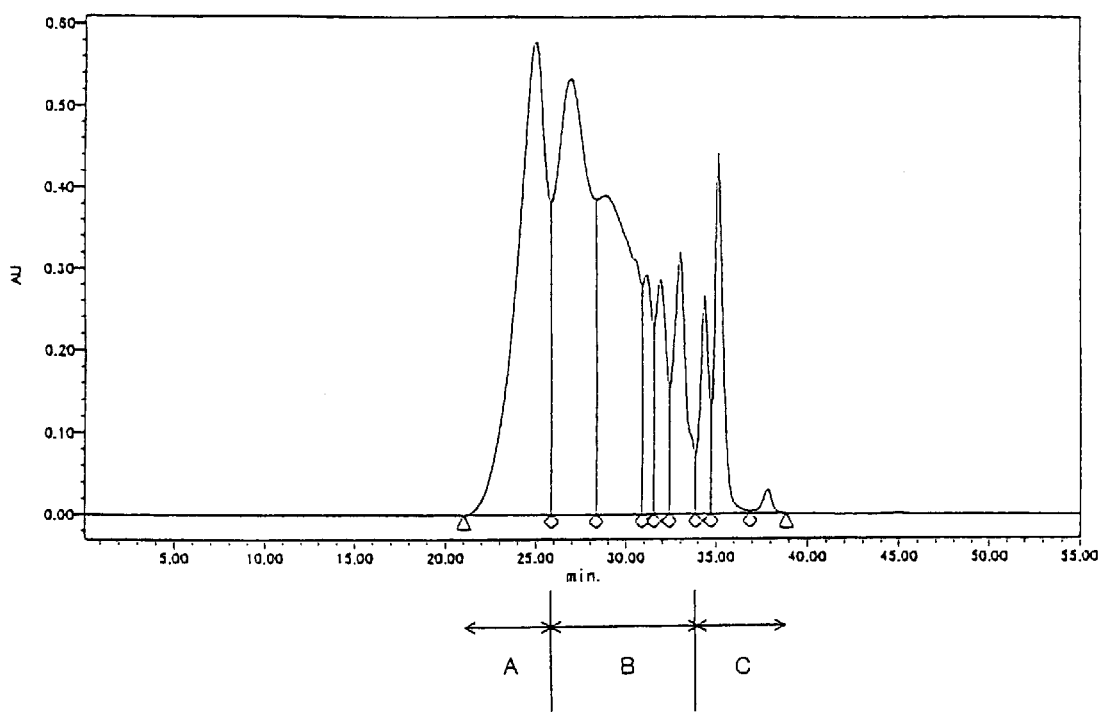
FIG. 1 is a GPC chart illustrating high molecular region A, middle molecular region B and monomer-dimer region C of a novolak resin.

To show the boundary molecular values of these regions in terms of weight average molecular weight determined by polystyrene standards, the boundary value between the middle region B and the high-molecular region A is about 12,000±10% measured under given GPC conditions, and the boundary value between the trimer-containing middle region B and the monomer/dimer region C is about 160±10%. One example thereof is shown in FIG. 1 obtained by GPC with a detector at 280 nm of a novolak resin, in which regions represented by A, B and C corresponds to the high-molecular region, middle-molecular region and monomer/dimer region, respectively.

In addition, molecular weight of the treated novolak resin is preferably 2,000–25,000 as determined by polystyrene standards. If weight average molecular weight of the novolak resin treated by thin film distillation method is less than 2,000, there result deteriorated patterned coating-remaining property and coating property whereas, if more than 25,000, there results a reduced sensitivity.

Further, the dissolution rate of novolak resin treated by the above-described thin film distillation method in 2.38 wt % aqueous tetramethylammonium hydroxide is preferably 100 Å or more. If the dissolution rate of novolak resin treated by the thin film distillation method is less than 100 Å, there results such a decreased sensitivity that pattern-forming ability is deteriorated or alkali-developing time is seriously prolonged, thus not being practical. Addition of a low molecular compound to prevent decrease in sensitivity tends to deteriorate heat resistance.

Additionally, in the present invention, monomer and dimer are removed by the thin film distillation method without removing the middle-molecular region, and hence it does not involve the problem of reduction in sensitivity as is different from the solvent fractionation method described in Japanese Unexamined Patent Publication No. H3-230164, etc. In this Japanese Unexamined Patent Publication No. H3-230164, this reduction in sensitivity is avoided by adding a low-molecular compound as a dissolution-accelerating agent. However, too much addition of the agent causes deterioration of heat resistance, and it is difficult to well balance sensitivity and heat resistance.

Materials constituting the radiation-sensitive resin composition of this invention will be described in more detail below.

Firstly, an alkali-soluble novolak resin to be used as a starting material for the radiation-sensitive resin composition of the present invention may be those which are manufactured by any conventionally known processes, for example, by polycondensation between at least one of phenols and an aldehyde such as formalin using oxalic acid as a catalyst.

As the phenols to be used for manufacturing this alkali-soluble novolak resin, there may be illustrated cresols such as o-cresol, p-cresol and m-cresol; xylenols such as 3,5-xylenol, 2,5-xylenol, 2,3-xylenol and 3,4-xylenol; trimethylphenols such as 2,3,4-trimethylphenol, 2,3,5-trimethylphenol, 2,4,5-5 trimethylphenol and 3,4,5-trimethylphenol; t-butylphenols such as 2-t-butylphenol, 3-t-butylphenol and 4-t-butylphenol; methoxyphenols such as 2-methoxyphenol, 3-methoxyphenol, 4-methoxyphenol, 2,3-dimethoxyphenol, 2,5-dimethoxyphenol and 3,5-dimethoxyphenol; ethylphenols such as 2-ethylphenol, 3-ethylphenol, 4-ethylphenol, 2,3-diethylphenol, 3,5-diethylphenol, 2,3,5-triethylphenol and 3,4,5-triethylphenol; chlorophenols such as o-chlorophenol, m-chlorophenol, p-chlorophenol and 2,3-dichlorophenol; resorcinols such as resorcinol, 2-methylresorcinol, 4-methylresorcinol and 5-methylresorcinol; catechols such as 5-methylcatechol; pyrogallols such as 5-methylpyrogallol; bisphenols such as bisphenol A, B, C, D, E and F; methylol-cresols such as 2,6-dimethylol-p-cresol; and naphthols such as α-naphthol and β-naphthol.

As the aldehydes, there may be used salicylaldehyde, paraformaldehyde, acetaldehyde, benzaldehyde, hydroxybenzaldehyde, chloroacetaldehyde, etc. independently or as a mixture of two or more as well as formalin.

In the present invention, the above-described novolak resin is subjected to a thin film distillation apparatus such as a centrifugal film distillation apparatus under the conditions of 5 to 10 Torr in pressure, 260 to 280° C. in temperature and well controlled residence time to thereby remove primarily monomer and dimer components. As is described above, the thin film distillation method has so far been applied to various polymer systems for the purpose of removing unreacted monomers, low molecular weight materials, volatile ingredients, etc., and the method employed in this invention is principally the same as the known method.

It is desirable for attaining the object of the present invention to adjust the content of monomer/dimer of a treated novolak resin to not more than 6% with minimizing removal of oligomers of trimer or longer molecules, i.e., with keeping the ratio in area in the profile in GPC of the middle molecular region after the treatment to that before the treatment, $B_2/B_1$ at 0.95 or more, by optimizing conditions of the thin film distillation. Because, if the monomer/dimer content exceeds 6%, there results undesired coating-remaining ratio and heat resistance and, if $B_2/B_1$ is less than 0.95, there results only insufficient sensitivity.

As the photosensitizer having a quinonediazide group, there may be used any of known ones which have conventionally been used for resists of quinonediazide-novolak system. In the present invention, those compounds are preferred which are obtained by reacting naphthoquinonediazidesulfonic acid chloride or benzoquinonediazidesulfonic acid chloride with a low-molecular or high-molecular compound having a functional group or groups capable of undergoing condensation reaction with the acid chlorides. As the group capable of undergoing condensation reaction with the acid chloride, there may be illustrated a hydroxyl group, an amino group, etc., with a hydroxyl group being particularly preferred. As the compound capable of condensing with an acid chloride having a hydroxyl group, there may be illustrated, for example, hydroquinone and resorcinol; hydroxybenzophenones such as 2,4-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone and 2,2',3,4,6'-pentahydroxybenzophenone; hydroxyphenylalkanes such as bis(2,4-dihydroxyphenyl)methane, bis(2,3,4-trihydroxyphenyl)methane and bis(2,4-dihydroxyphenylpropane; and hydroxytriphenylmethanes such as 4,4',3",4"-tetrahydroxy-3,5,3',5'-tetramethyltriphenylmethane, 4,4',2",3",4"-pentahydroxy-3,5,3',5'-tetramethyltriphenylmethane; and the like. These may be used independently or in combination of two or more of them.

The photosensitizer having a quinonediazide group is usually incorporated in an amount of 5 to 50 parts by weight, preferably 10 to 40 parts by weight, based on 100 parts by weight of the alkali-soluble resin.

The novolak resin of the present invention may be a photosensitive novolak resin. Such photosensitive novolak resin may be obtained by reacting the above-described alkali-soluble novolak resin with a photosensitizer having a quinonediazide group to thereby substitute the hydroxyl group of said novolak resin.

As a solvent for dissolving the radiation-sensitive resin composition of the present invention, there may be illustrated ethylene glycol monoalkyl ethers such as ethylene glycol monomethyl ether and ethylene glycol monoethyl ether; ethylene glycol monoalkyl ether acetates such as ethylene glycolmonomethyl ether acetate and ethylene glycol monoethyl ether acetate; propylene glycol monoalkyl ethers such as propylene glycol monomethyl ether and propylene glycol monoethyl ether; propylene glycol monoalkyl ether acetates such as propylene glycol monomethyl ether acetate and propylene glycol monoethyl ether acetate; lactic esters such as methyl lactate and ethyl lactate; aromatic hydrocarbons such as toluene and xylene; ketones such as methyl ethyl ketone, 2-heptanone, and cyclohexanone; amides such as N,N-dimethylacetamide and N-methylpyrrolidone; and lactones such as γ-butyrolactone. These solvents may be used alone or as a mixture of two or more of them.

In the radiation-sensitive resin composition of the present invention may optionally be incorporated, if necessary, those additives which have conventionally been used, such as dyes, adhesion assistants, surfactants, etc. As dyes, there may be used, for example, Methyl Violet, Crystal Violet and Malachite Green. As adhesion assistants, there may be used, for example, alkylimidazolines, butyric acid, alkyl acids, polyhydroxystyrene, polyvinyl methyl ether, t-butylnovolak, epoxysilane, epoxy polymers and silanes. As surfactants, there may be illustrated, for example, nonionic surfactants such as polyglycols (e.g., polypropylene glycol) and the derivatives thereof (e.g., polyoxyethylene lauryl ether), fluorine-containing surfactants such as Fluorad (trade name; manufactured by Sumitomo 3M Co.), Megafac (trade name; manufactured by Dainippon Ink Co.) and Sulfuron (trade name; manufactured by Asahi Glass Co.), and organic siloxane surfactants such as KP341 (trade name; manufactured by Shin-etsu Kagaku Kogyo K.K.).

Furthermore, the radiation-sensitive resin composition of the present invention may be used in combination with an inorganic anti-reflective coating of TiN, SiN, SiON or the like or an organic anti-reflective coating of AZ® BARLi®, AZ® BARLi® II (manufactured by Clariant (Japan) K.K.).

The radiation-sensitive resin composition of the present invention is applied, for example, on a substrate of silicon wafer having an anti-reflective coating provided thereon, by spin coating or the like, and the substrate on which the radiation-sensitive resin composition has been coated is subjected to baking to form a radiation-sensitive resin coating on it. In forming a resist pattern, the substrate having thereon the radiation-sensitive resin coating is patternwise exposed with radiation such as ultraviolet rays, deep ultraviolet rays, X-rays or electron beam and is developed with an alkaline developing solution to form a positive resist pattern with high resolution and good pattern profile.

BEST MODE FOR PRACTICING THE INVENTION

The present invention will now be described more specifically by reference to Examples which, however, are not to be construed to limit the present invention in any way.

SYNTHESIS EXAMPLE 1

Synthesis of Starting Novolak Resin A-1

Figure 2:
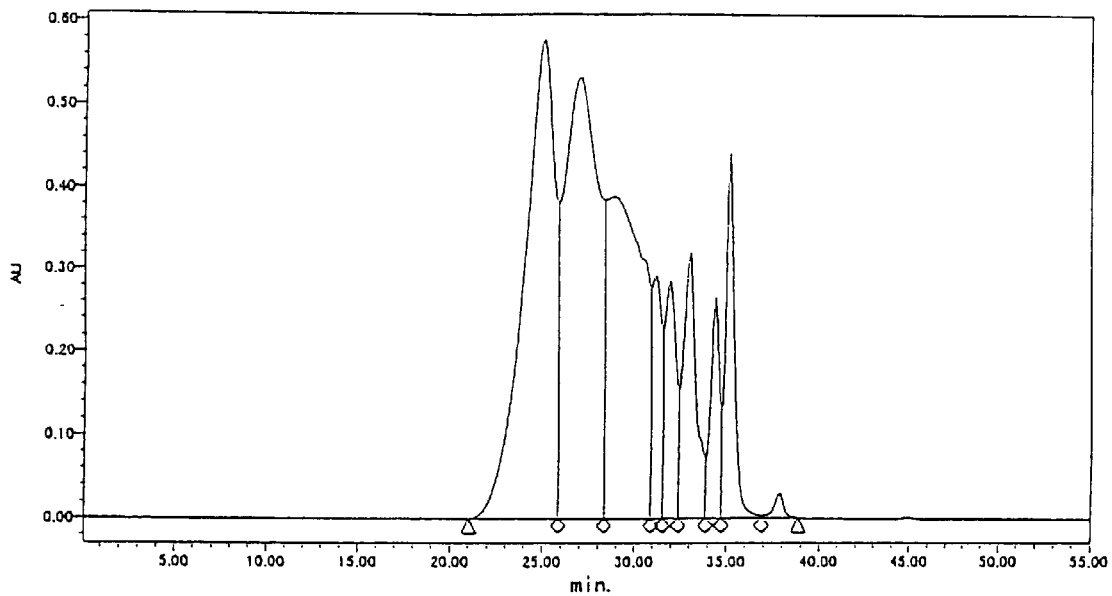
FIG. 2 are a GPC chart and a peak table of starting novolak resin A-1.

58.6 g of m-cresol, 42.8 g of p-cresol, 15.8 g of 2,5-xylenol, 6.1 g of 2,4-xylenol, 85.2 g of 37% aqueous formalin and 0.986 g of oxalic acid were charged in a 1-liter separable flask equipped with a stirrer, a condenser and a thermometer, and reaction was conducted at 95–100° C. for 5 hours under stirring. Then, water and unreacted monomers were distilled off over 1 hour by raising the temperature up to 180° C., and the pressure inside the flask was reduced to 10 mmHg while raising the temperature up to 195° C. to remove water, unreacted monomers, formaldehyde and oxalic acid as much as possible, followed by decreasing the temperature to about room temperature to recover novolak resin. The thus-obtained novolak resin A-1 was subjected to gel permeation chromatography (GPC) at a detecting wavelength of 280 nm under the following "conditions for measuring molecular weight of novolak resin" to obtain the results shown in FIG. 2. It is seen from the results that weight average molecular weight (Mw) of the novolak resin A-1 is 10,900, and that the ratios in area in its profile of molecular region $A_1:B_1:C_1$ are 0.267:0.635:0.098.

Additionally, in the following procedures, molecular weight of novolak resin was measured by GPC in the same manner as in Synthesis Example 1.

(Conditions for Measuring Molecular Weight of Novolak Resin)

Measurement of molecular weight of novolak resin was conducted using GPC columns (one column of KF-804, two columns of KF-802 and one column of KF-801 made by Showa Denko Co.) at a flow rate of 1.0 ml/min and at a column temperature of 40° C. with a mobile phase of THF (tetrahydrofuran) adapted for liquid chromatography.

SYNTHESIS EXAMPLE 2

Figure 3:
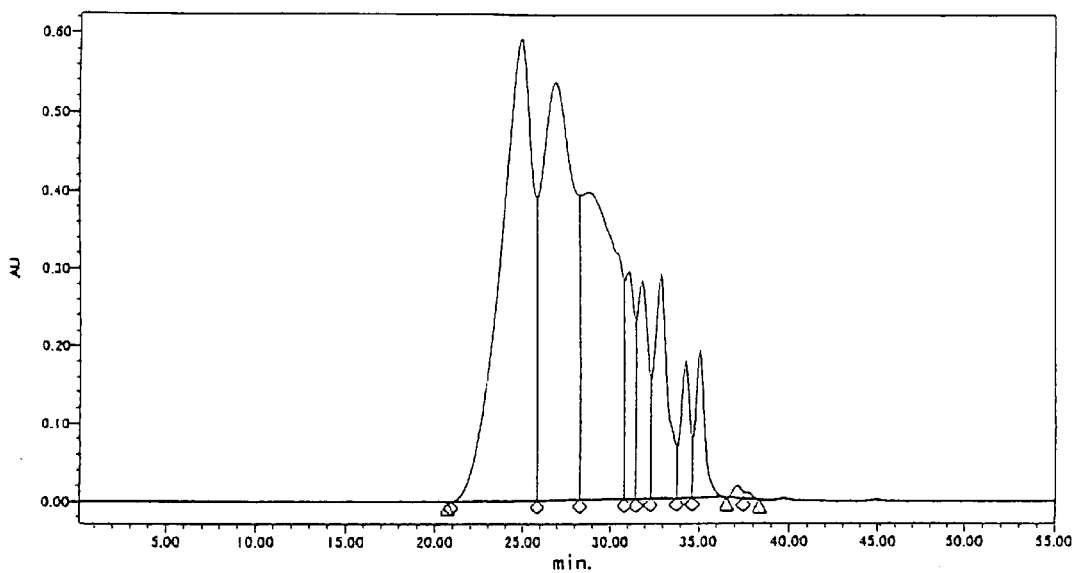
FIG. 3 are a GPC chart and a peak table of novolak resin A-2 obtained by treating the starting novolak resin A-1 according to thin film distillation method.

Preparation of Novolak Resin A-2 Obtained by Removing Low Molecular Materials from Novolak Resin A-1 by Thin Film Distillation Method 400 g of the novolak resin A-1 obtained in Synthesis Example 1 was dissolved in 600 g of propylene glycol monomethyl ether acetate (PGMEA), pure water was added to this solution, and the mixture was stirred for 15 minutes. After allowing to stand for 30 minutes at about room temperature, the PGMEA resin solution layer was taken out, flowed into a thin film distillation apparatus (manufactured by Hitachi Ltd.), and thin film distillation was conducted at 260° C. under reduced pressure of 15 mmHg with continuously dropping the PGMEA resin solution to recover novolak resin A-2. Molecular weight of the novolak resin A-2 was measured according to GPC to obtain the results shown in FIG. 3. The results of the measurement show that weight average molecular weight (Mw) of the novolak resin A-2 is 14,800, and the ratios in area in the profile of molecular weight region $A_2:B_2:C_2$ are 0.304:0.641 0.055.

SYNTHESIS EXAMPLE 3

Figure 4:
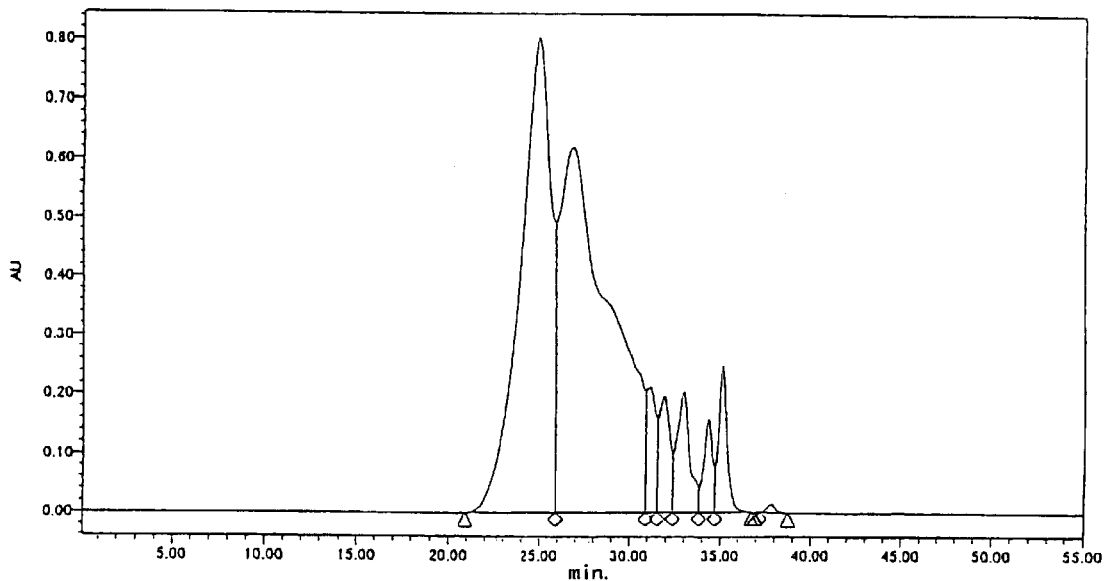
FIG. 4 are a GPC chart and a peak table of novolak resin A-3 obtained by treating the starting novolak resin A-1 according to solvent fractionation method.

Preparation of Novolak Resin A-3 Obtained by Removing Low Molecular Materials from Novolak Resin A-1 by Solvent Fractionation Method 450 g of the novolak resin A-1 obtained in Synthesis Example 1 was dissolved in 1150 g of PGMEA, and poured into a 3-liter beaker. After gradually adding thereto 1071 g of heptane under stirring at 500 rpm using a stirrer, rotation rate was increased to 4000 rpm, followed by stirring for 30 minutes. Then, this novolak resin solution was transferred into a separating funnel and, after still standing for 12 hours at room temperature, the PGMEA resin solution layer (lower layer) was separated out, and heptane remaining in the PGMEA resin solution was removed by an evaporator to obtain a PGMEA solution of novolak resin A-3. Molecular weight of the novolak resin A-3 was measured according to GPC to obtain the results shown in FIG. 4. The results of the measurement show that weight average molecular weight (Mw) of the novolak resin A-3 is 18,500, and the ratios in area in the profile of molecular weight region $A_2:B_2:C_2$ are 0.372:0.573:0.055.

From these ratios in area, values of $B_2/B_1$ and $C_2/(A_2+B_2+C_2)$ for the resins A-1, A-2 and A-3 obtained in Synthesis Examples 1 to 3 are calculated to be as shown in Table 1.

Measurement and calculation of dissolution rates of the resins A-1, A-2 and A-3 were conducted in the following manner. Results obtained are shown in Table 1.
(Measurement and Calculation of Dissolution Rate of Novolak Resin)

20 g each of the novolak resins A-1, A-2 and A-3 obtained in Synthesis Examples were respectively dissolved in 80 g of propylene glycol monomethyl ether acetate, then filtered through a 0.5 µm Teflon filter. Each of the thus obtained resin solutions was applied on a HMDS-treated 4-inch silicon wafer using a spin coater (LARC ULTIMA-1000; made by Lithotech Japan Co.) and baked at 100° C. for 90 seconds on a hot plate to obtain about 1-µm thick resin coating. Thickness of the coating was accurately measured using a film thickness-measuring apparatus (Lambda Ace; made by Dainippon Screen Co.). The obtained silicon wafers were dipped into an alkaline developer solution [AZ® 300MIF developer; 2.38 wt % aqueous solution of tetramethylammonium hydroxide; made by Clariant (Japan) K.K.] kept at 23° C., and a time necessary for the coating on wafer to be completely dissolved was measured. Dissolution rates of the novolak resins were calculated from the dissolution time data.

SYNTHESIS EXAMPLE 4

Synthesis of Photosensitizer B-1

1 mol of 2,3,4,4'-tetrahydroxybenzophenone was used as a phenol, and 1,2-naphthoquinonediazide-5-sulfonic acid chloride was dissolved in 3-fold molar amount of acetone to prepare a 10% solution. 1.1-fold molar equivalents of triethylamine based on 1,2-naphthoquinonediazide-5-sulfonic acid chloride was dropwise added thereto under the condition as maintaining the temperature of reaction solution between 20–23° C., followed by stirring for further 30 minutes. Precipitated triethylamine hydrochloride was filtered off, and the reaction solution was poured into 10 times amount of a 0.1 N hydrochloric acid aqueous solution. A precipitated solid was collected by filtration, washed with super-pure water, then dried in vacuo to obtain a photosensitizer of naphthoquinonediazidesulfonic acid ester B-1.

EXAMPLE 1

Comparative Examples 1–2

Novolak resins A-1 to A-3 and photosensitizer B-1 obtained in Synthesis Examples were mixed in the proportions shown in Table 1 below, a surfactant of Megafac R-08 (manufactured by Dainippon Ink Chemical Industry, Co.) was added thereto, and the resulting mixtures were respectively dissolved in PGMEA. Then, each of the solutions was filtered through a 0.5 µm membrane Teflon filter to obtain radiation-sensitive resin compositions for Example 1 and Comparative Examples 1 and 2.

Each of these radiation-sensitive resin compositions was applied on a HMDS (hexamethyldisilazan)-treated 4-ich silicon wafer using a spin coater (LARC ULTIMA-1000) made by Lithotech Japan Co., prebaked on a hot plate at 100° C. for 90 seconds so as to obtain a 1.5-µm thick resist coating. Thickness of the coating was measured using a film thickness-measuring apparatus (Lambda Ace) made by Dainippon Screen Co. Then, each of the resist coatings was exposed with stepwise changed radiation amount using a stepper having a exposure wavelength of g-line (436 nm) (made by GCA Co.; DSW 6400 NA=0.42), then developed with an alkaline developing solution made by Clariant Japan Co. [AZ® 300MIF Developer; 2.38 wt % aqueous solution of tetramethylammonium hydroxide] at 23° C. for 60 seconds according to a paddle method to obtain resist patterns. Then, thickness of the coatings was again measured.

Next, each of the thus obtained resist patterns was observed under a scanning electron microscope (SEM) to observe sensitivity and heat resistance. Results thus obtained are tabulated in Table 1.

Additionally, sensitivity, coating-remaining ratio and heat resistance were evaluated in the following manner.

(1) Sensitivity

A minimum exposure energy amount necessary for resolving 10-µm line-and-space (L/S) was taken as $E_{th}$ (Threshold Energy), and an exposure energy amount for forming 10-µm line-and-space, L/S, with a designed dimension of mask was taken as $E_o$ (Optimum Energy).

(2) Coating-remaining Ratio

A value calculated according to the following formula was taken as a coating-remaining ratio (%).

Coating-remaining ratio=[(thickness of coating before exposure–thickness of coating in unexposed area after development)/thickness of coating before exposure]×100

(3) Heat Resistance

Wafers having thereon a 10-µm L/S pattern were heated on a hot plate each for 120 seconds with changing temperature. Cross-sectional profile of the line pattern was observed under SEM, and a temperature at which top of the resist pattern became round was taken as the temperature indicating heat resistance.

TABLE 1

| | Novolak resin | | | Photosensitizer | | Sensitivity (mJ/cm²) | | Coating-remaining ratio | Heat resistance | Ratio in area in GPC chart | |
|---|---|---|---|---|---|---|---|---|---|---|---|
| | Compound | Additional amount (parts by weight) | Dissolution ratio (Å/sec) | Compound | Additional amount (parts by weight) | Eth | Eo | (%) | (° C.) | $B_2/B_1$ | $C_2/(A_2 + B_2 + C_2)$ |
| Example 1 | A-2 | 100 | 183 | B-1 | 22.5 | 40.9 | 51.6 | 99.1 | 130 | 1.01 | 0.055 |
| Comparative example 1 | A-1 | 100 | 415 | B-1 | 22.5 | 3.1 | 3.9 | 58.7 | 115 | — | 0.098 |
| Comparative example 2 | A-3 | 100 | 95 | B-1 | 22.5 | 59.2 | 70.2 | 98.9 | 130 | 0.90 | 0.055 |

As has been described hereinbefore, decrease in the coating-remaining ratio was avoided by selectively removing monomer and dimer so that the amounts of monomer and diner in a novolak resin falls within a given range through thin film distillation method. Further, reduction in sensitivity was avoided since a component of middle molecular region is less removed than in the case of removing the monomer and dimer by solvent fractionation method, thus a radiation-sensitive resin composition having well balanced properties being obtained.

Advantages of the Invention

As has been described in detail hereinbefore, the radiation-sensitive resin composition of the present invention has excellent and well-balanced various properties required for photoresist, such as sensitivity, pattern profile and heat resistance.

INDUSTRIAL UTILITY

The radiation-sensitive resin composition of the present invention is extremely useful as a resist material for manufacturing semi-conductors such as LSI, forming display surface of LCD panel, and for manufacturing a circuit substrate for a thermal head and the like.

What is claimed is:

1. A radiation-sensitive resin composition comprising an alkali-soluble resin and a photosensitizer having a quinonediazide group, wherein the alkali-soluble resin is a novolak resin treated by a thin film distillation method, wherein said novolak resin treated by a film distillation method shows the following ratio in area in its profile in gel permeation chromatography with a detector at 280 nm:

$$B_2/B_1 \geq 0.95,\ C_2/(A_2+B_2+C_2) \geq 0.060$$

wherein $A_1$ is a high-molecular region, $B_1$ is a middle-molecular region, and $C_1$ is a monomer/dimer region before fractional treatment of the novolak resin, and $A_2$, $B_2$ and $C_2$ are the corresponding counterparts after fractional treatment of the novolak resin.

2. A radiation-sensitive resin composition according to claim 1 wherein the weight-average molecular weight of said novolak resin treated by a thin film distillation method is in the range of 2,000 to 25,000 as determined by polystyrene standards.

3. A radiation-sensitive resin composition according to claim 1 wherein the dissolution rate of said novolak resin treated by a thin film distillation method in 2.38 wt % aqueous tetramethyl ammonium hydroxide is 100 angstrom/sec. or more.

4. A radiation-sensitive resin composition comprising an alkali-soluble resin and a photosensitizer having a quinonediazide group, wherein the alkali-soluble resin is a novolak resin treated by a thin film distillation method, wherein said thin film distillation method is conducted subsequent to removal by distillation under reduced pressure of water and unreacted monomers during synthesis of said novolak resin, and wherein said novolak resin treated by a film distillation method shows the following ratio in area in its profile in gel permeation chromatography with a detector at 280 nm:

$$B_2/B_1 \geq 0.95,\ C_2/(A_2+B_2+C_2) \geq 0.060$$

wherein $A_1$ is a high-molecular region, $B_1$ is a middle-molecular region, and $C_1$ is a monomer/dimer region before fractional treatment of the novolak resin, and $A_2$, $B_2$ and $C_2$ are the corresponding counterparts after fractional treatment of the novolak resin.

5. A radiation-sensitive resin composition according to claim 4 wherein the weight-average molecular weight of said novolak resin treated by a thin film distillation method is in the range of 2,000 to 25,000 as determined by polystyrene standards.

6. A radiation-sensitive resin composition according to claim 4 wherein the dissolution rate of said novolak resin treated by a thin film distillation method in 2.38 wt % aqueous tetra methyl ammonium hydroxide is 100 angstrom/sec. or more.

* * * * *